United States Patent
Santin et al.

(10) Patent No.: US 7,002,828 B2
(45) Date of Patent: Feb. 21, 2006

(54) FLASH CELL FUSE CIRCUIT

(75) Inventors: Giovanni Santin, Santa Rufina (IT); Giovanni Naso, Frosinone (IT)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 10/642,961

(22) Filed: Aug. 18, 2003

(65) Prior Publication Data

US 2004/0052121 A1    Mar. 18, 2004

Related U.S. Application Data

(62) Division of application No. 09/943,643, filed on Aug. 30, 2001, now Pat. No. 6,654,272.

(30) Foreign Application Priority Data

Feb. 27, 2001 (IT) .......................... RM2001A0105

(51) Int. Cl.
*G11C 17/00* (2006.01)
(52) U.S. Cl. ....................... 365/96; 365/198
(58) Field of Classification Search ................ 365/96, 365/198
See application file for complete search history.

(56) References Cited

U.S. PATENT DOCUMENTS

| | | |
|---|---|---|
| 5,233,566 A | 8/1993 | Imamiya |
| 5,300,840 A | 4/1994 | Drouot |
| 5,852,580 A | 12/1998 | Ha |
| 5,880,996 A | 3/1999 | Roohparvar |
| 5,905,687 A | 5/1999 | Brede |
| 5,912,841 A | 6/1999 | Kim |
| 5,995,413 A | 11/1999 | Holzmann |
| 6,111,785 A | 8/2000 | Hirano |
| 6,281,739 B1 | 8/2001 | Matsui |
| 6,307,801 B1 | 10/2001 | Ogawa |
| 6,331,949 B1 | 12/2001 | Hirano |
| 6,462,985 B1 * | 10/2002 | Hosono et al. ........ 365/185.09 |
| 6,784,223 B1 * | 8/2004 | Krohn .......................... 522/92 |

* cited by examiner

*Primary Examiner*—M. Tran
(74) *Attorney, Agent, or Firm*—Leffert Jay & Polglaze, PA

(57) ABSTRACT

Fuse circuits based on a single flash cell or floating-gate memory cell are adapted for use in memory devices, particularly in low-voltage, flash memory applications. The fuse circuits include a floating-gate memory cell for storing a data value and a fuse latch to hold and transfer the data value of the floating-gate memory cell at power-up or upon request. A latch driver circuit can write data values to the fuse latch without affecting the data value stored in the floating-gate memory cell. The fuse circuits can further utilize the same structure, pitch, bit-line organization and word-line organization as the memory device's memory array. As the fuse circuits can utilize the same structure and organization, the data value of the fuse circuit can be programmed, erased and read using the same data path as the regular memory array.

22 Claims, 6 Drawing Sheets

FLASH CELL FUSE CIRCUIT

This application is a divisional of U.S. patent application Ser. No. 09/943,643 (allowed), filed Aug. 30, 2001 U.S. Pat. No. 6,654,272 and titled, "FLASH CELL FUSE CIRCUIT" which is commonly assigned and incorporated by reference in its entirety herein, and which claims priority to Italian Patent Application Serial No. RM2001A000105 filed Feb. 27, 2001, which is commonly assigned. The present invention relates generally to semiconductor memory devices, and in particular, the present invention relates to flash cell (floating-gate memory cell) fuse circuits, their applications and their operation.

TECHNICAL FIELD OF THE INVENTION

Background of the Invention

Electronic information handling or computer systems, whether large machines, microcomputers or small and simple digital processing devices, require memory for storing data and program instructions. Various memory systems have been developed over the years to address the evolving needs of information handling systems. One such memory system includes semiconductor memory devices.

Semiconductor memory devices are rapidly-accessible memory devices. In a semiconductor memory device, the time required for storing and retrieving information generally is independent of the physical location of the information within the memory device. Semiconductor memory devices typically store information in a large array of cells.

Computer, communication and industrial applications are driving the demand for memory devices in a variety of electronic systems. One important form of semiconductor memory device includes a non-volatile memory made up of floating-gate memory cells called flash memory. Flash memory is often used where regular access to the data stored in the memory device is desired, but where such data is seldom changed. Computer applications use flash memory to store BIOS firmware. Peripheral devices such as printers store fonts and forms on flash memory. Digital cellular and wireless applications consume large quantities of flash memory and are continually pushing for lower operating voltages and higher densities. Portable applications such as digital cameras, audio recorders, personal digital assistants (PDAs) and test equipment also use flash memory as a medium to store data.

Conventional flash memory cells make use of a floating-gate transistor including a source region, a drain region, a floating-gate layer and a control-gate layer. In such devices, access operations are carried out by applying biases to each of these terminals. Write operations are generally carried out by channel hot-carrier injection. This process induces a flow of electrons between the source and the drain, and accelerates them toward a floating gate in response to a positive bias applied to the control gate. Erase operations are generally carried out through Fowler-Nordheim tunneling. This process may include electrically floating the drain region, grounding the source region, and applying a high negative voltage to the control gate. Read operations generally include sensing a current between the source and the drain, i.e., the MOSFET current, in response to a bias applied to the control gate. If the memory cell is programmed, its threshold voltage will be near or above the control-gate bias such that the resulting current is low to non-existent. If the memory cell is erased, its threshold voltage is well below the control-gate bias such that the current is substantially higher.

Although attempts have been made to carefully control the fabrication of such memory devices so as to increase their yield, there invariably will be differences in operating characteristics of memory devices fabricated at different times. These differences in operating characteristics are primarily due to processing variations and may even occur between different semiconductor wafers in a single batch of wafers. By way of example, in a flash memory device, the threshold voltage of memory cell of one memory device may change one amount after applying programming biases and a cell of another supposedly identical memory device may change a different amount after applying the same programming biases. In order to accommodate such variations in memory device characteristics, designs may allow for adjustment or trimming of voltages generated by the memory device. By trimming such internally-generated analog voltages, both memory devices can operate using the same supply voltages and the same timing characteristics, thus making their differing operating characteristics transparent to the end user. Fuse banks are often used to store such trimming parameters.

Fuse banks may also find use in device redundancy. Redundancy is the practice of fabricating additional or redundant elements, e.g., a row or column of memory cells that can be activated to replace a defective primary element. During testing, if a defective primary element is identified, its location address may be stored in a fuse bank associated with a redundant element. Addresses received by the memory device are compared to the fuse bank to determine whether access should be directed to a primary element or to the associated redundant element. Other uses of fuse banks include storage of enable bits for specific test configurations.

Fuse banks generally contain banks of non-volatile storage locations. While fuse banks may contain banks of fusible links as their storage elements, they may alternatively contain other non-volatile storage elements such as anti-fuses as well as floating-gate transistors. The state of the individual storage elements, e.g., open circuit or closed circuit in the case of fuses and anti-fuses, and programmed or erased in the case of floating-gate transistors, determines the parameter value stored in a fuse bank.

FIG. 1 is an example of a fuse circuit 100 utilizing floating-gate transistors as non-volatile storage elements. The fuse circuit 100 uses a flip-flop configuration with two floating-gate transistors and may be referred to as a double flash cell. The fuse circuit 100 includes p-channel field-effect transistors (pFETs) 120 and 122 having their sources coupled to a first potential node 124. The first potential node 124 is coupled to receive a first potential, such as a supply potential Vcc. The pFET 120 has its gate coupled to the drain of the pFET 122 at node 138 while the pFET 122 has its gate coupled to the drain of the pFET 120 at node 136. An n-channel field-effect transistor (nFET) 116 has a drain coupled to the drain of the pFET 120, a source coupled to a floating-gate transistor 112 and a gate coupled to control node 134. An nFET 118 has a drain coupled to the drain of the pFET 122, a source coupled to a floating-gate transistor 114 and a gate coupled to control node 134. The floating-gate transistors 112 and 114 each have a source coupled to a second potential node and a gate coupled to control node 132. The second potential node 126 is coupled to receive a second potential lower than the first potential, such as a ground potential Vss. The fuse circuit 100 further includes an inverter 128 having an input coupled to the node 136 and an output coupled to the fuse circuit output 130.

The floating-gate transistor 112 is programmed and the floating-gate transistor 114 is erased to store a first fuse data value while the floating-gate transistor 112 is erased and the floating-gate transistor 114 is programmed to store a second fuse data value. To read the fuse circuit 100, a logic high signal is applied to control nodes 132 and 134, thus activating the nFETs 116 and 118 and activating one of the floating-gate transistors 112 or 114. Applying a logic high signal to control node 134 will couple the floating-gate transistors 112 and 114 between the first potential node 124 and the second potential node 126. Due to the cross-coupled nature of the pFETs 120 and 122, one will latch activated while the other will latch deactivated depending on the data value stored by the floating-gate transistors 112 and 114. For the schematic shown, a logic low data value is presented at the fuse circuit output 130 if the fuse circuit 100 is storing the first data value and a logic high data value is presented at the fuse circuit output 130 if the fuse circuit 100 is storing the second data value. As device operating voltages are reduced, fuse circuits of the type shown in FIG. 1 may become inoperable or may latch too slowly for effective operation.

For the reasons stated above, and for other reasons stated below which will become apparent to those skilled in the art upon reading and understanding the present specification, there is a need in the art for alternative fuse circuits for use in memory devices and apparatus making use of such memory devices, as well as methods of their operation.

SUMMARY OF THE INVENTION

The above-mentioned problems with memory devices and other problems are addressed by the present invention and will be understood by reading and studying the following specification.

Fuse circuits based on a single flash cell or floating-gate memory cell are adapted for use in memory devices, particularly in low-voltage applications. Such fuse circuits include a floating-gate memory cell for storing a data value and a fuse latch to hold and transfer the data value of the floating-gate memory cell at power-up or upon request. A latch driver circuit can write data values to the fuse latch without affecting the data value stored in the floating-gate memory cell. The ability to write to the fuse latch without affecting the stored data value can be useful in testing of the memory device. The fuse circuits can further utilize the same structure, pitch, bit-line organization and word-line organization as the memory device's memory array, thus simplifying fabrication and leading to more efficient use of die area. As the fuse circuits can utilize the same structure and organization, the data value of the fuse circuit can be programmed, erased and read using the same data path as the regular memory array.

For one embodiment, the invention provides a fuse circuit. The fuse circuit includes a floating-gate transistor having a first source/drain region, a second source/drain region, and a gate. The fuse circuit further includes a reset transistor having a first source/drain region coupled to a first potential node, a second source/drain region coupled to a latch input node, and a gate coupled to a first control node. The fuse circuit still further includes a set transistor having a first source/drain region coupled to the latch input node, a second source/drain region coupled to the first source/drain region of the floating-gate transistor, and a gate coupled to a second control node. The fuse circuit still further includes a fuse latch having an input coupled to the latch input node and an output coupled to an output node. For a further embodiment, the fuse circuit includes a latch driver circuit capable of setting an output value of the fuse latch without regard to, and without disturbing the data value of, the floating-gate transistor.

For another embodiment, the invention provides a memory device having an array of floating-gate memory cells, each memory cell located at an intersection of a word line and a local bit line. The memory device includes a reset transistor having a first source/drain region coupled to a first potential node, a second source/drain region coupled to a latch input node, and a gate coupled to a first control node. The memory device further includes a set transistor having a first source/drain region coupled to the latch input node, a second source/drain region coupled to a first local bit line, and a gate coupled to a second control node. The memory device still further includes a fuse latch having an input coupled to the latch input node and an output coupled to an output node. For a further embodiment, a first source/drain region of a first floating-gate memory cell is coupled to the first local bit line, a second source/drain region of the first floating-gate memory cell is coupled to a second potential node, and a gate of the first floating-gate memory cell is coupled to a first word line of the memory device. For a still further embodiment, the memory device includes a latch driver circuit coupled to the fuse circuit capable of setting an output value of the fuse latch without regard to, and without disturbing the data value of, the first floating-gate memory cell.

For yet another embodiment, the invention provides a method of operating a memory device. The method includes deactivating a first field-effect transistor having a first source/drain region coupled to a fuse latch input node and a second source/drain region coupled to a local bit line of the memory device, and activating a second field-effect transistor having a first source/drain region coupled to a first potential node and a second source/drain region coupled to the fuse latch input node. The method further includes resetting a fuse latch in response to deactivating the first field-effect transistor and activating the second field-effect transistor, wherein the fuse latch has an input coupled to the fuse latch input node and an output coupled to an output node. For a further embodiment, the method includes deactivating the second field-effect transistor subsequent to resetting the fuse latch. For a still further embodiment, the method includes activating the first field-effect transistor subsequent to deactivating the second field-effect transistor, and driving a word line of a floating-gate memory cell coupled to the local bit line.

For still another embodiment, the invention provides a method of operating a memory device. The method includes generating a first control signal indicative of whether it is desired to set a fuse latch of a first fuse circuit to some fuse data value without regard to a data value of a floating-gate memory cell associated with the first fuse circuit and generating a second control signal indicative of the fuse data value. The method further includes deactivating a first field-effect transistor and a second field-effect transistor when the first control signal has a first logic level, wherein the first field-effect transistor is coupled between a first potential node and an output node of the fuse circuit, and wherein the second field-effect transistor is coupled between a second potential node and the output node of the fuse circuit. The method still further includes selectively activating either the first field-effect transistor or the second field-effect transistor in response to a logic level of the second control signal when the first control signal has a second logic level.

The invention further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1:
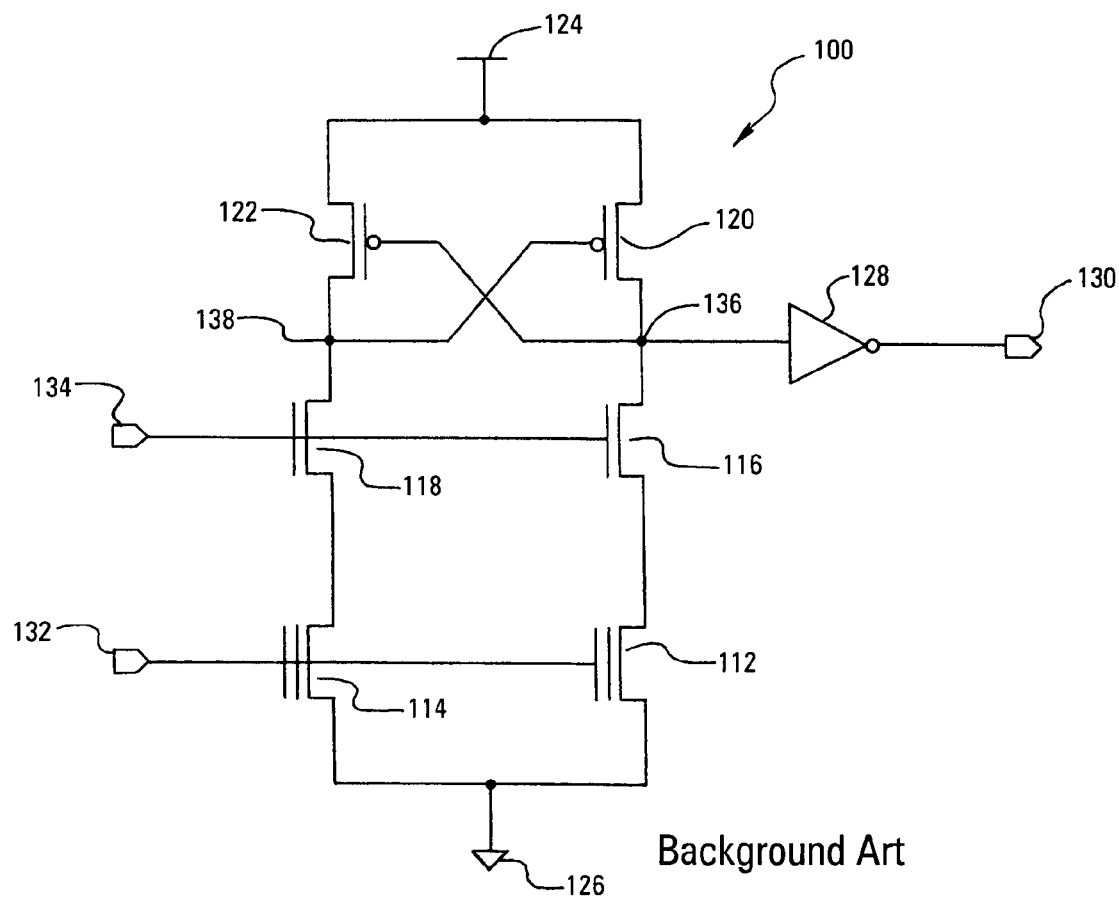
FIG. 1 is a schematic of a typical fuse circuit utilizing floating-gate transistors as non-volatile storage elements.
Figure 2:
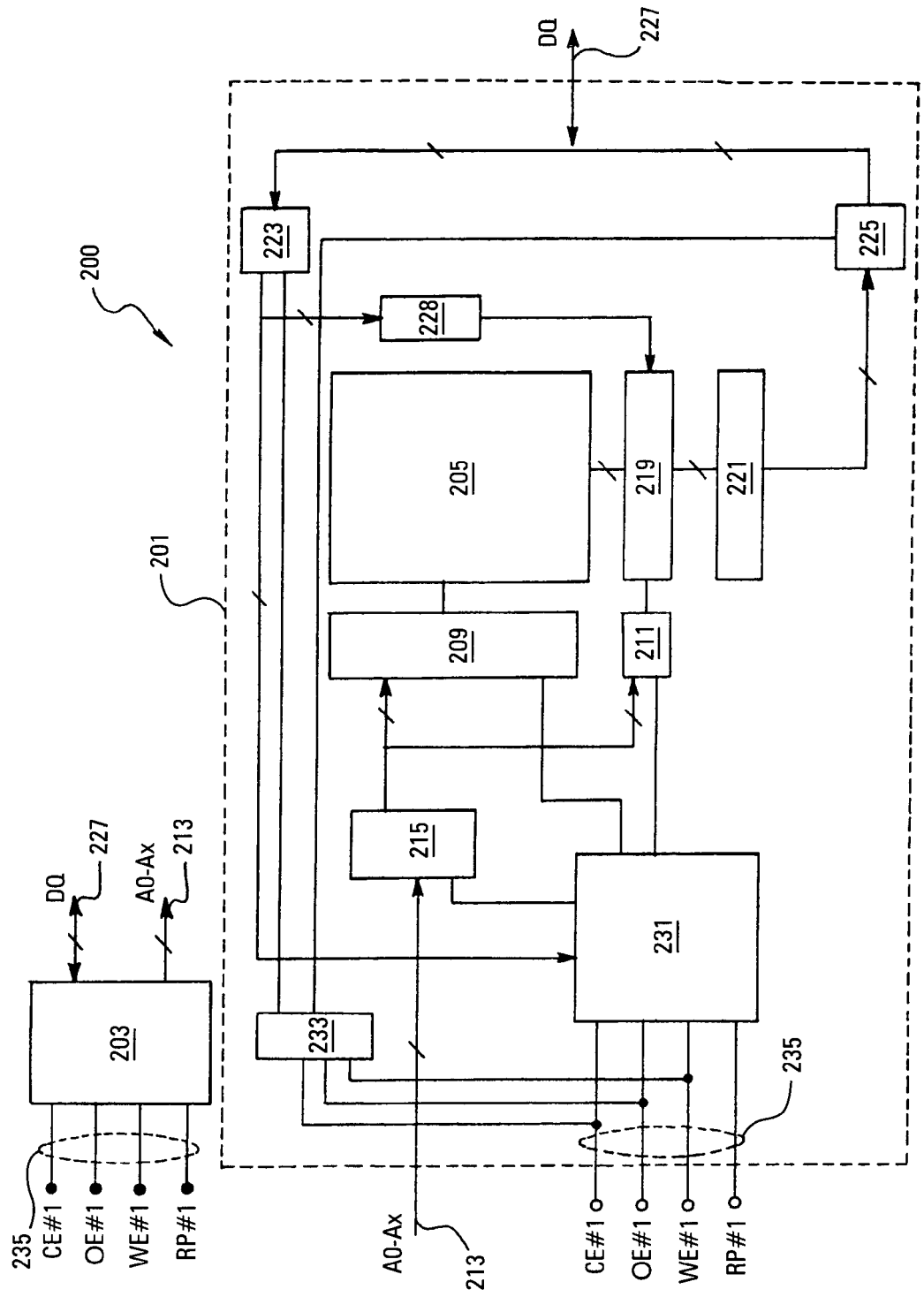
FIG. 2 is a functional block diagram of a basic flash memory device coupled to a processor in accordance with an embodiment of the invention.

FIG. 2 is a functional block diagram of a basic flash memory device 201 that is coupled to a processor 203. The memory device 201 and the processor 203 may form part of an electronic system 200. The memory device 201 has been simplified to focus on features of the memory that are helpful in understanding the present invention. The memory device 201 includes an array of memory cells 205. The memory array 205 includes at least one fuse circuit in accordance with the embodiments of the invention.

The memory cells may be non-volatile floating-gate memory cells having their gates coupled to word lines, first source/drain regions coupled to local bit lines, and second source/drain regions coupled to an underlying semiconductor region. Each memory cell is thus located at an intersection of a word line and a local bit line. The memory array 205 is arranged in rows and columns, with the rows arranged in blocks. A memory block is some discrete portion of the memory array 205. Individual word lines generally extend to only one memory block while bit lines may extend to multiple memory blocks. The memory cells generally can be erased in blocks. Data, however, may be stored in the memory array 205 separate from the block structure.

A row decoder 209 and a column decoder 211 are provided to decode address signals provided on address lines A0–Ax 213. An address buffer circuit 215 is provided to latch the address signals. Address signals are received and decoded to access the memory array 205. Column select circuitry 219 is provided to select one or more columns of the memory array 205 in response to control signals from the column decoder 211. Sensing circuitry 221 is used to sense and amplify data stored in the memory cells. Data input 223 and output 225 buffer circuits are included for bi-directional data communication over a plurality of data (DQ) lines 227 with the processor 203. A data latch 229 is typically provided between data input buffer circuit 223 and the memory array 205 for storing data values (to be written to a memory cell) received from the DQ lines 227. Data amplified by the sensing circuitry 221 is provided to the data output buffer circuit 225 for output on the DQ lines 227.

Command control circuit 231 decodes signals provided on control lines 235 from the processor 203. These signals are used to control the operations on the memory array 205, including data read, data write, and erase operations. Input/output control circuit 233 is used to control the data input buffer circuit 223 and the data output buffer circuit 225 in response to some of the control signals. As stated above, the flash memory device 201 has been simplified to facilitate a basic understanding of the features of the memory. A more detailed understanding of flash memories is known to those skilled in the art. As is well known, such memory devices 201 may be fabricated as integrated circuits on a semiconductor substrate.

Figure 3:
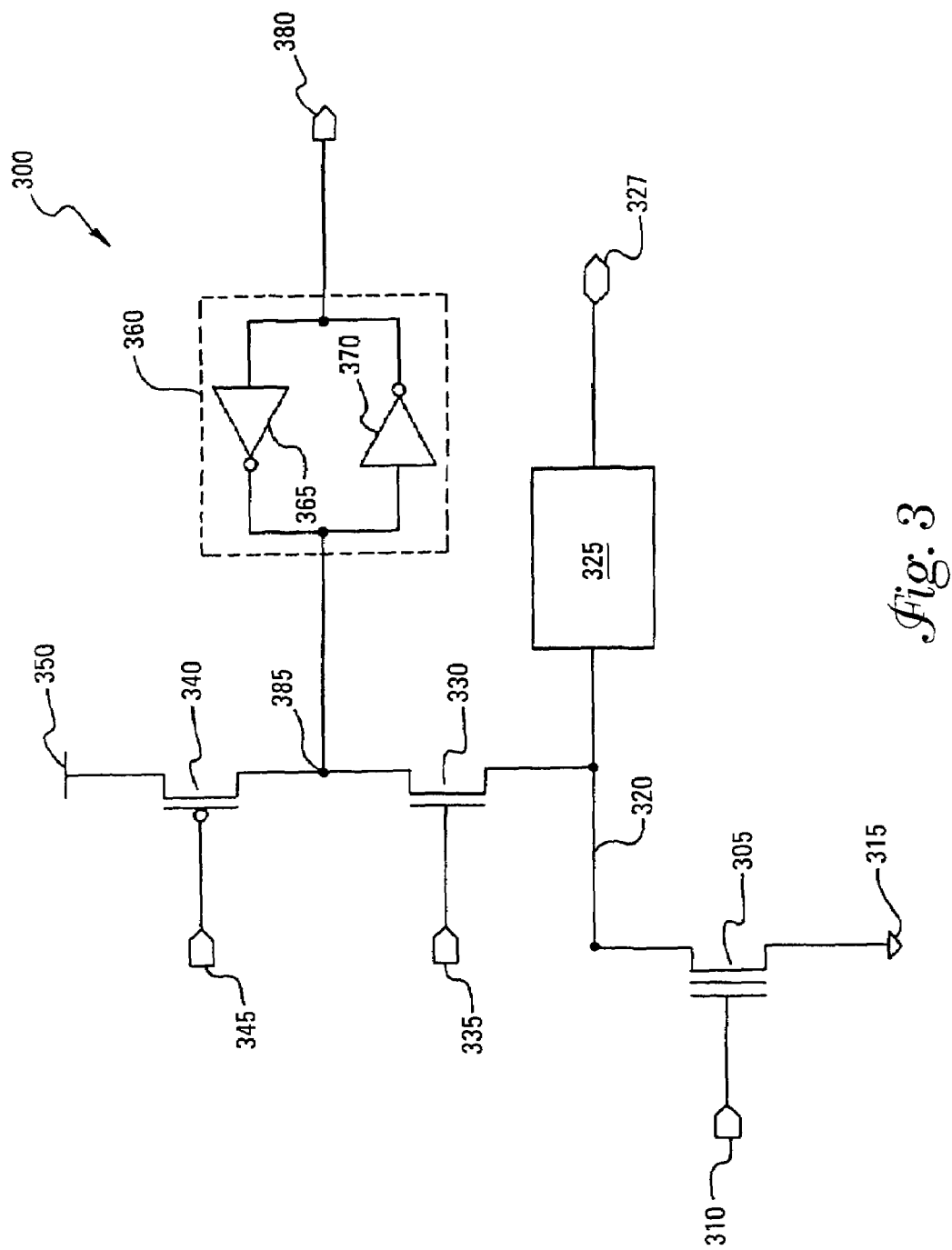
FIG. 3 is a schematic of a fuse circuit in accordance with an embodiment of the invention.

FIG. 3 is a schematic of a fuse circuit 300 in accordance with an embodiment of the invention. The fuse circuit 300 includes a flash or floating-gate memory cell 305. The floating-gate memory cell 305 is a floating-gate transistor having a first source/drain region coupled to a local bit line 320, a control gate coupled to a word line 310 and a second source/drain region coupled to a potential node 315. Potential node 315 is coupled to receive a potential representative of a logic low level such as a ground potential Vss. The bit line 320 may be coupled to a DQ line 327 through the data path 325. The data path 325 generally includes the column select circuitry, sensing circuitry and buffer circuits of the memory device used to access the memory array either to read the status of a memory cell or to program a memory cell. More than one floating-gate memory cell 305 may be coupled to the bit line 320.

The bit line 320 is further coupled to a potential node 350 through a select transistor, such as n-channel field-effect transistor (nFET) 330, and a reset transistor, such as p-channel field-effect transistor (pFET) 340. Potential node 350 is coupled to receive a potential representative of a logic high level such as a supply potential Vcc. The supply potential Vcc may be less than 2V. For example, Vcc may have a nominal value of approximately 1.8V and a range of approximately 1.65V to 2.0V. The set transistor 330 and the reset transistor 340 are coupled in series between the potential node 350 and the bit line 320. The set transistor 330 has a first source/drain region coupled to a latch input node 385, a second source/drain region coupled to the bit line 320 and a gate coupled to a control node 335. The reset transistor 340 has a first source/drain region coupled to the potential node 350, a second source/drain region coupled to the node 385 and a gate coupled to a control node 345.

The fuse circuit 300 may further include a fuse latch 360 having an input coupled to the node 385 and an output coupled to the output node 380. The fuse latch 360 may include a typical reverse-coupled inverter pair, such as inverters 365 and 370, for latching the fuse data value.

The floating-gate memory cells 305 of the fuse circuit 300 can be programmed and erased using the same procedures as are used for the standard floating-gate memory cells of the memory array. That is, appropriate biases are applied to the bit line 320, the word line 310 and the potential node 315 to either accumulate or remove charge from the floating gate of the floating-gate memory cells 305. As with the standard memory cells of the memory array, the floating-gate memory cells 305 of the fuse circuit 300 can be programmed individually or a word at a time, and they can be erased by sector or blocks.

Prior to reading the data value of a floating-gate memory cell 305 of the fuse circuit 300, the fuse latch 360 should be reset, preferably to a logic low output level. This can be accomplished by activating the reset transistor 340 and deactivating the set transistor 330. The reset transistor 340 can be activated substantially simultaneously to deactivating the set transistor 330. Alternatively, the reset transistor 340 can be activated subsequent to activating the set transistor 330. However, to avoid disturbing the bit line 320, it is generally advised not to activate the reset transistor 340 prior to deactivation of the set transistor 330.

For the fuse circuit 300 depicted in FIG. 3, the reset transistor 340 is activated by applying a reset signal RSB to control node 345 as a first control signal having a logic low level. The set transistor 330 is deactivated by applying a set signal SET to control node 335 as a second control signal having a logic low level. This action isolates the floating-gate memory cell 305 from the fuse latch 360 and applies the supply potential from potential node 350 to the input of the fuse latch 360, thus bringing the output of the fuse latch 360 and the fuse output node 380 to a logic low level. If the reset signal RSB and the set signal SET are local control signals, fuse latches 360 of multiple fuse circuits 300 may be reset individually. If the reset signal RSB and the set signal SET are global control signals, fuse latches 360 of multiple fuse circuits 300 will be reset concurrently. The reset transistor 340 should pass a current level in excess of any current sink by the inverter 365 in order to ensure resetting the fuse latch 360.

After resetting the fuse latch 360, the data value of the floating-gate memory cell 305 can be transferred to its fuse latch 360 by deactivating the reset transistor 340, activating the set transistor 330 and driving the word line 310 with a control signal Fuse_WL. The control signal Fuse_WL is a read voltage Vread applied to the control gate of the floating-gate memory cell 305. The read voltage Vread is typically generated internal to the memory device, such as by a charge pump. The read voltage Vread has a potential level sufficient to activate the floating-gate memory cell 305 if its floating gate is erased, i.e., having a first data value, but insufficient to fully activate the floating-gate memory cell 305 if its floating gate is programmed, i.e., having a second data value. For one embodiment, Vread is approximately 5V. While transferring the data value of the floating-gate memory cell 305 to its fuse latch 360, the data path 325 associated with the local bit line 320 may be unselected.

Upon deactivating the reset transistor 340, activating the set transistor 330 and driving the word line 310, the floating-gate memory cell 305 will either impede or sink current from the node 385 depending upon its programming state. If the floating-gate memory cell 305 is erased, it will sink current from node 385. Accordingly, a floating-gate memory cell 305 having the first data value will pull the node 385 down to the potential of the potential node 315 and transition the fuse latch 360 to present a logic high level on its output. The inverter 365 of the fuse latch 360 should not drive a current level greater than the current sink of an erased floating-gate memory cell 305 in order to properly transition the fuse latch 360 to present the logic high level on its output. If the floating-gate memory cell 305 is programmed, it will impede current from the node 385. Accordingly, a floating-gate memory cell 305 having the second data value will tend to maintain the node 385 near the potential of the potential node 350, thus maintaining the output logic level of the fuse latch 360 at the logic low level.

The two phases of latch reset and cell-to-latch transfer can occur automatically at power-up. To ensure proper operation of the fuse circuits 300, the control signals RSB, SET and FuseWL should not be asserted until Vcc and Vread are stable.

Figure 4:
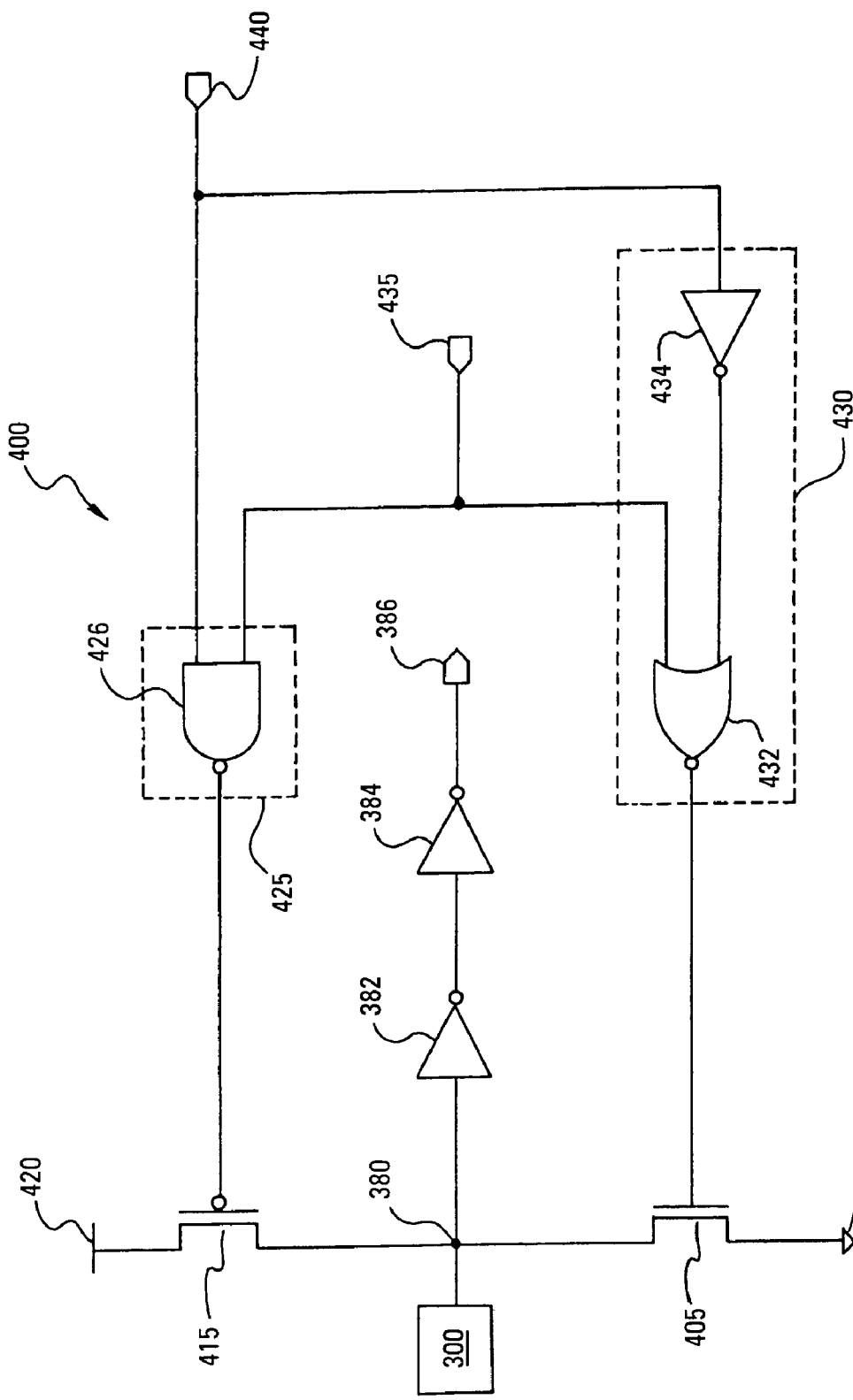
FIG. 4 is a schematic of one latch driver circuit for use with a fuse circuit in accordance with an embodiment of the invention.

It may be desirable to set the fuse latch 360 of the fuse circuit 300 to a particular value regardless of the data value stored in the floating-gate memory cell 305. FIG. 4 is a schematic of a latch driver circuit 400 in accordance with an embodiment of the invention and capable of setting the output value of the fuse latch 360 without regard to, and without disturbing the data value of, the floating-gate memory cell 305. The latch driver circuit 400 is coupled downstream of the fuse latch circuit 360, such as at output node 380. FIG. 4 shows that the fuse data value presented at output node 380 may be further buffered or conditioned, such as by a pair of inverters 382 and 384 in series, prior to output at node 386.

The latch driver circuit 400 includes an nFET 405 having a first source/drain region coupled to the output node 380. The nFET 405 has a second source/drain region coupled to a potential node 410. The potential node 410 is coupled to receive a potential level representative of a logic low level, such as the ground potential Vss. The potential node 410 may be coupled to receive the same potential level as the potential node 315 of the fuse circuit 300. The latch driver circuit 400 further includes a pFET 415 having a first source/drain region coupled to a potential node 420 and a second source/drain region coupled to the output node 380. The potential node 420 is coupled to receive a potential level representative of a logic high level, such as the supply potential Vcc. The potential node 420 may be coupled to receive the same potential level as the potential node 350 of the fuse circuit 300.

The nFET 405 has a gate coupled to an output of a logic circuit 430. The pFET 415 has a gate coupled to an output of a logic circuit 425. The logic circuits 425 and 430 each have a first input for receiving a control signal on control node 440 indicative of whether the latch driver circuit 400 is enabled and addressed, i.e., whether it is desired to set the fuse latch 360 of the fuse circuit 300 to some data value without regard to the data value of the associated floating-gate memory cell 305. The logic circuits 425 and 430 each have a second input for receiving a control signal on control node 435 indicative of the data value to be written to the fuse latch 360.

The logic circuits 425 and 430 should deactivate pFET 415 and nFET 405, respectively, if the control signal on control node 440 indicates a desire to disable the latch driver circuit 400 or indicates that the latch driver circuit 400 is not addressed. If the latch driver circuit 400 is addressed and enabled, the logic circuits 425 and 430 should further activate either pFET 415 or nFET 405, but not both, depending upon the data value to be written to the fuse latch 360. To write a logic low level to the fuse latch 360, the nFET 405 should be activated. To write a logic high level to the fuse latch 360, the pFET 415 should be activated. As one example, this can be accomplished using a NAND gate 426 as the logic circuit 425, and a NOR gate 432 having an input coupled to an output of an inverter 434 as the logic circuit 430.

With reference to FIG. 4, the NAND gate 426 receiving a logic low level from control node 440 will deactivate the pFET 415 regardless of a logic level of the second input from control node 435. If the control node 440 provides a logic high level on the first input of the NAND gate 426, the output of the NAND gate 426 will activate the pFET 415 in response to a logic high level received from the control node 435 and deactivate the pFET 415 in response to a logic low level received from the control node 435. Furthermore, a logic low level received from control node 440 will transition the output of the inverter 434 to a logic high level, thus forcing the output of the NOR gate 432 to a logic low level. This will deactivate the nFET 405 regardless of a logic level received from the control node 435. If the control node 440 provides a logic high level to the input of the inverter 434, the output of the NOR gate 432 will be responsive to the logic level of the control signal received on its second input from control node 435, deactivating the nFET 405 in response to a logic high level received from the control node 435 and activating the nFET 405 in response to a logic low level received from the control node 435.

Figure 5A:
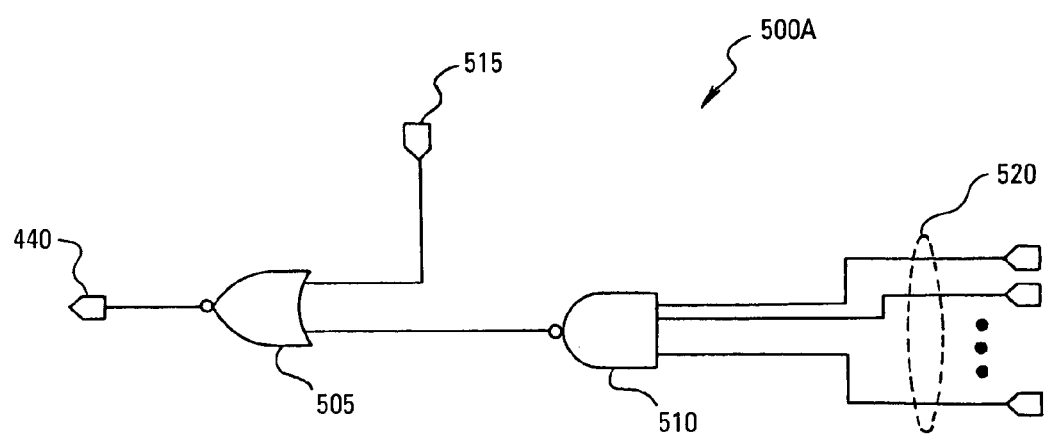
FIGS. 5A–5B are schematics of address and enable circuits for use with latch driver circuits in accordance with embodiments of the invention.

The control signal presented at control node 440 may be a composite of several control signals such as an enable signal and multiple address signals. FIG. 5A is a schematic of an address and enable circuit 500A for use with latch driver circuits 400 in accordance with an embodiment of the invention showing how an enable signal and address signals may be combined to produce the control signal presented at control node 440.

The address and enable circuit 500A includes a NOR gate 505 having an output coupled to the control node 440. The NOR gate 505 further has a first input coupled to control node 515 for receiving an enable signal and a second input coupled to an output of a NAND gate 510 for receiving an address match signal. The NAND gate 510 has multiple inputs, each coupled to one of the address match lines 520. The address match lines 520 will present control signals indicative of whether there is an address match between the desired fuse circuit and the fuse circuit associated with the address and enable circuit 500A. For example, each address match line 520 may present a logic high level if each address bit of the desired fuse circuit matches the corresponding address bit of the associated fuse circuit. One or more address match lines 520 may likewise present a logic low level if one or more address bits of the desired fuse circuit differ from the corresponding address bits of the associated fuse circuit. Thus, the NAND gate 510 may present a logic low level on its output if the address of the associated fuse circuit matches the desired fuse circuit and a logic high level on its output if the address of the associated fuse circuit differs from the desired fuse circuit. For the address and enable circuit 500A of FIG. 5A, the enable signal presented on control node 515 would have a logic low level if the fuse circuit were to be enabled and a logic high level if the fuse circuit were to be disabled. The output of the NOR gate 505, and thus the control node 440, would then have a logic high level if the fuse circuit were to be enabled and the address of the fuse circuit were to match the desired fuse circuit. Likewise, the output of the NOR gate 505, and thus the control node 440, would have a logic low level if either the fuse circuit were to be disabled or the address of the fuse circuit were to differ from the desired fuse circuit.

Figure 5B:
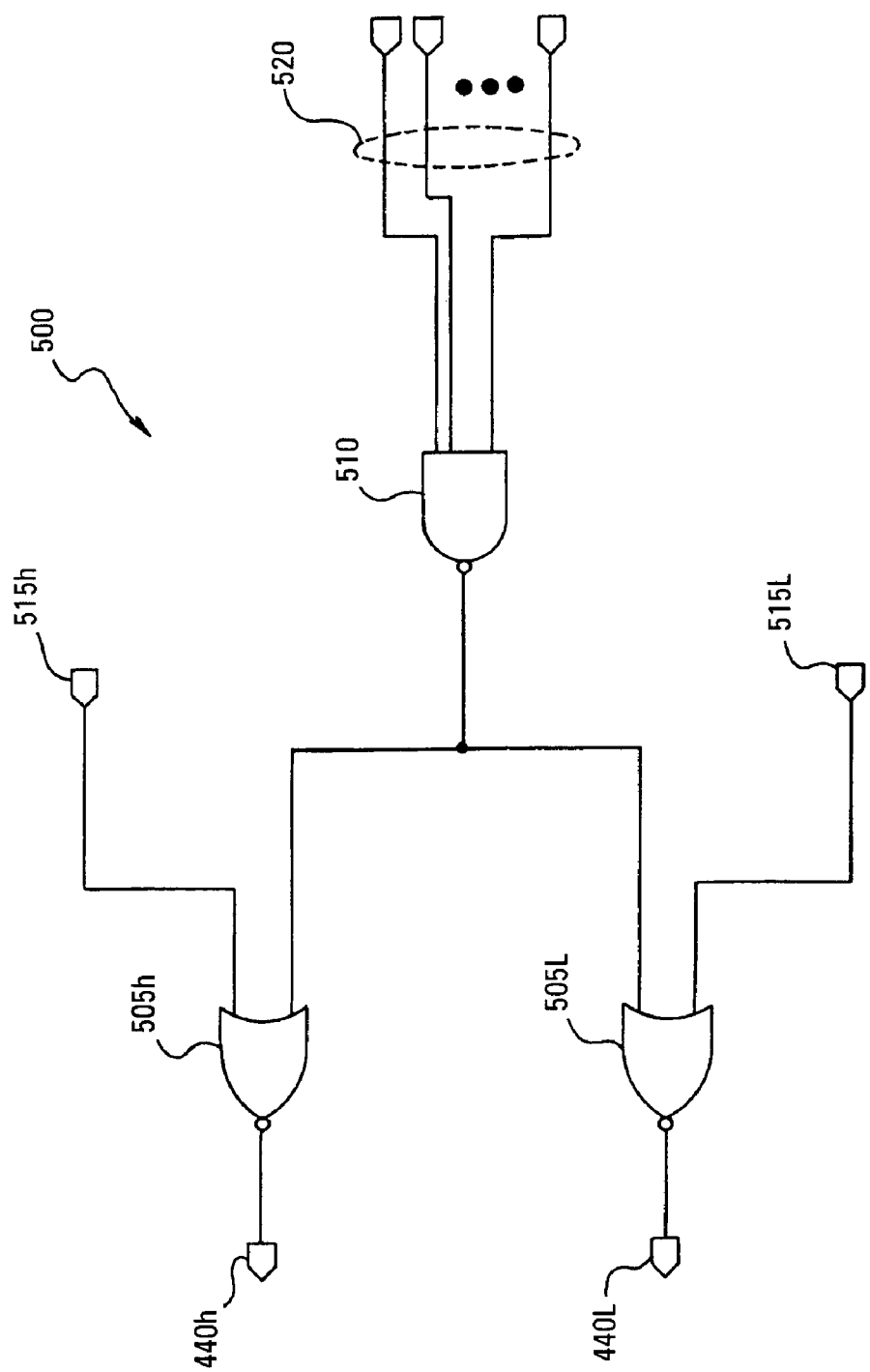

FIG. 5B is a schematic of an address and enable circuit 500B for use with latch driver circuits in accordance with an embodiment of the invention showing how address signals and multiple enable signals may be combined to produce control signals for more than one latch driver circuit.

Fuse latches are typically written with the same parallelism of the DQ lines. If a DQ bus is composed of 16 DQ lines, 16 fuse latches can be written at the same time. Changing the fuse address allows one to write to different sets of 16 fuse latches. To increase the number of memory devices that can be tested with a given tester hardware, such tester hardware often utilizes only a subset of each memory device's DQ lines, e.g., 8 of the 16 DQ lines. The address and enable circuit 500B allows one to write to a subset of the fuse latches for a given fuse address, e.g., the upper 8 fuse latches, without affecting the remaining subset of the fuse latches for the given fuse address, e.g., the lower 8 fuse latches. Using the example of a memory device having 16 DQ [15:0] lines and tester hardware making use of 8 DQ [7:0] lines, enabling the control signal presented on control node $515_h$ and disabling the control signal presented on control node $515_l$ allows one to write the data present on DQ [7:0] lines to 8 of the fuse latches, such as the upper 8 addressed fuse latches. Similarly, disabling the control signal presented on control node $515_h$ and enabling the control signal presented on control node $515_l$ allows one to write the data present on DQ [7:0] lines to a different 8 of the fuse latches, such as the lower 8 addressed fuse latches.

The address and enable circuit 500B includes a first NOR gate $505_h$ having an output coupled to the control node $440_h$ and a second NOR gate $505_l$ having an output coupled to the control node $440_l$. The first NOR gate $505_h$ further has a first input coupled to control node $515_h$ for receiving a first enable signal and a second input coupled to an output of a NAND gate 510 for receiving an address match signal. The second NOR gate $505_l$ further has a first input coupled to control node $515_l$ for receiving a second enable signal and a second input coupled to the output of the NAND gate 510 for receiving the address match signal.

For the address and enable circuit 500B of FIG. 5B, the first enable signal presented on control node $515_h$ would have a logic low level if the fuse circuit associated with control node $440_h$ were to be enabled and a logic high level if the fuse circuit associated with control node $440_h$ were to be disabled. Similarly, the second enable signal presented on control node $515_l$ would have a logic low level if the fuse circuit associated with control node $440_l$ were to be enabled and a logic high level if the fuse circuit associated with control node $440_l$ were to be disabled. The output of the NOR gates $505_h$ and $505_l$, and thus the control nodes $440_h$ and $440_l$, respectively, would then have a logic high level if their associated fuse circuit were to be enabled and the NAND gate 510 were to indicate an address match. Likewise, the output of the NOR gates $505_h$ and $505_l$, and thus the control nodes $440_h$ and $440_l$, respectively, would have a logic low level if either their associated fuse circuit were to be disabled or the NAND gate 510 were to indicate an address mismatch. The second enable signal may be the binary complement of the first enable signal such that the fuse circuit associated with control node $440_h$ would be enabled when the fuse circuit associated with control node $440_l$ would be disabled, and vice versa. Alternatively, the first and second enable signals may have the same logic level such that both fuse circuits would be either enabled or disabled. Latch driver circuits 500B of the type shown in FIG. 5B may be adapted for use with more than two fuse circuits, or more than two subsets of fuse circuits, by providing additional NOR gates 505 and additional enable signals.

CONCLUSION

Fuse circuits have been described herein based on a single flash cell or floating-gate memory cell. Such fuse circuits are adapted for use in memory devices, particularly in low-voltage, flash memory applications. The fuse circuits include a floating-gate memory cell for storing a data value and a fuse latch to hold and transfer the data value of the floating-gate memory cell at power-up or upon request. A latch driver circuit can write data values to the fuse latch without affecting the data value stored in the floating-gate memory cell. The ability to write to the fuse latch without affecting the stored data value can be useful in testing of the memory device. The fuse circuits can further utilize the same structure, pitch, bit-line organization and word-line organization as the memory device's memory array, thus simplifying fabrication and leading to more efficient use of die area. As the fuse circuits can utilize the same structure and organization, the data value of the fuse circuit can be programmed, erased and read using the same data path as the regular memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a memory device, comprising:
   deactivating a first field-effect transistor having a first source/drain region coupled to a fuse latch input node and a second source/drain region coupled to a local bit line of a memory array of the memory device;
   activating a second field-effect transistor having a first source/drain region coupled to a first potential node and a second source/drain region coupled to the fuse latch input node; and
   resetting a fuse latch in response to deactivating the first field-effect transistor and activating the second field-effect transistor, wherein the fuse latch has an input coupled to the fuse latch input node and an output coupled to an output node.

2. The method of claim 1, wherein activating the second field-effect transistor occurs subsequent to deactivating the first field-effect transistor.

3. The method of claim 1, wherein activating the second field-effect transistor and deactivating the first field-effect transistor occur substantially simultaneously.

4. The method of claim 1, wherein the first field-effect transistor is an n-channel field-effect transistor and the second field-effect transistor is a p-channel field-effect transistor.

5. The method of claim 1, wherein the fuse latch includes a pair of reverse-coupled inverters.

6. The method of claim 1, wherein the method is performed automatically upon power-up of the memory device.

7. A method of operating a memory device, comprising:
   deactivating a first field-effect transistor having a first source/drain region coupled to a fuse latch input node and a second source/drain region coupled to a local bit line of a memory array of the memory device;
   activating a second field-effect transistor having a first source/drain region coupled to a first potential node and a second source/drain region coupled to the fuse latch input node;
   resetting a fuse latch in response to deactivating the first field-effect transistor and activating the second field-effect transistor, wherein the fuse latch has an input coupled to the fuse latch input node and an output coupled to an output node; and
   deactivating the second field-effect transistor subsequent to resetting the fuse latch.

8. The method of claim 7, further comprising:
   activating the first field-effect transistor subsequent to deactivating the second field-effect transistor; and
   driving a word line of a floating-gate memory cell coupled to the local bit line.

9. The method of claim 8, wherein driving the word line occurs while a data path associated with the local bit line is unselected.

10. The method of claim 8, further comprising:
    latching a data value of the floating-gate memory cell in the fuse latch.

11. The method of claim 8, further comprising:
    reading the data value of the floating-gate memory cell using a data path of the memory array.

12. The method of claim 8, further comprising:
    writing a data value to the floating-gate memory cell using a data path of the memory array.

13. The method of claim 7, wherein the method is performed automatically upon power-up of the memory device.

14. A method of operating a memory device, comprising:
    generating a first control signal indicative of whether it is desired to set a fuse latch of a first fuse circuit to some fuse data value without regard to a data value of a floating-gate memory cell associated with the first fuse circuit;
    generating a second control signal indicative of the fuse data value;
    deactivating a first field-effect transistor and a second field-effect transistor when the first control signal has a first logic level, wherein the first field-effect transistor is coupled between a first potential node and an output node of the fuse circuit, and wherein the second field-effect transistor is coupled between a second potential node and the output node of the fuse circuit; and
    selectively activating either the first field-effect transistor or the second field-effect transistor in response to a logic level of the second control signal when the first control signal has a second logic level.

15. The method of claim 14, wherein generating the first control signal comprises combining a plurality of address match signals in a NAND gate and combining an output of the NAND gate with an enable signal in a NOR gate.

16. The method of claim 15, further comprising:
    combining the output of the NAND gate with a second enable signal in a second NOR gate, thereby generating a third control signal; and
    applying the third control signal to a second fuse circuit.

17. A method of operating a memory device, comprising:
    resetting the fuse latch to an initial fuse data value prior to transferring the data value to the fuse latch;

programming a floating-gate memory cell to a cell data value using a data path of the memory device; and transferring the cell data value to a fuse latch.

18. The method of claim 17, wherein resetting the fuse latch further comprises:

isolating the floating-gate memory cell from an input of the fuse latch; and applying a supply potential to the input of the fuse latch.

19. The method of claim 18, wherein transferring the cell data value to the fuse latch further comprises:

isolating the input of the fuse latch from the supply potential;

coupling the floating-gate memory cell to the input of the fuse latch; and applying a read voltage to a gate of the floating-gate memory cell.

20. The method of claim 19, wherein the read voltage has a potential level sufficient to activate the floating-gate memory cell if it is erased, but insufficient to fully activate the floating-gate memory cell if it is programmed.

21. The method of claim 17, further comprising:

setting the fuse latch to a data value without regard to, and without disturbing the data value of, the floating-gate transistor.

22. The method of claim 17, wherein the method is performed automatically upon power-up of the memory device.

* * * * *